United States Patent [19]

Miyamoto et al.

[11] Patent Number: 4,513,026
[45] Date of Patent: Apr. 23, 1985

[54] METHOD FOR COATING A SEMICONDUCTOR DEVICE WITH A PHOSPHOSILICATE GLASS

[75] Inventors: Hidekazu Miyamoto, Sagamihara; Yoshimi Shioya, Yokohama; Mamoru Maeda, Tama; Mikio Takagi, Kawasaki, all of Japan

[73] Assignee: Fujitsu Limited, Kawasaki, Japan

[21] Appl. No.: 518,329

[22] Filed: Aug. 1, 1983

Related U.S. Application Data

[63] Continuation of Ser. No. 295,618, Aug. 24, 1981, abandoned.

[30] Foreign Application Priority Data

Aug. 29, 1980 [JP] Japan ............................ 55-119357
Nov. 5, 1980 [JP] Japan ............................ 55-155361

[51] Int. Cl.³ ........................................ H01L 21/316
[52] U.S. Cl. ........................................ 427/85; 427/95; 427/255.3; 427/255
[58] Field of Search ............ 427/255.3, 95, 85, 255.1, 427/255.2, 255

[56] References Cited

U.S. PATENT DOCUMENTS

| | | | |
|---|---|---|---|
| 4,005,240 | 1/1977 | Schlacter | 427/95 X |
| 4,033,286 | 7/1977 | Chern et al. | 427/255.1 |
| 4,098,923 | 7/1978 | Alberti et al. | 427/255.3 X |
| 4,196,232 | 4/1980 | Schnable et al. | 427/95 X |

FOREIGN PATENT DOCUMENTS 58760 5/1978 Japan .
125979 9/1979 Japan .

OTHER PUBLICATIONS

Kern et al., "Advances in Deposition Processes for Passivation Films," *J. Vac. Sci. Technol.*, vol. 14, No. 5, Sep./Oct. 1977, pp. 1082–1085.

Primary Examiner—John D. Smith
Assistant Examiner—Bernard F. Plantz
Attorney, Agent, or Firm—Staas & Halsey

[57] ABSTRACT

A semiconductor device having a deposited phosphosilicate glass film, containing an insubstantial amount of hydrogen and a low phosphorus concentration, is manufactured at a high mass productivity. This semiconductor device is manufactured by first placing plural substrates for semiconductor devices to be treated in a reaction tube so that the main surfaces of the substrates are substantially vertically aligned with respect to one another and are substantially perpendicularly intersected by the central axis of the reaction tube, the reaction tube being provided with at least two gas feed pipes having plural small openings pierced along the longitudinal direction thereof. Second, a silicon compound gas is introduced through one of the gas feed pipes into the reaction tube and an oxidizing gas is introduced through the other of the gas feed pipes into the reaction tube, while the inside of the reaction tube is maintained a reduced low pressure, whereby phosphosilicate glass films are deposited on the main surfaces of the substrates.

9 Claims, 8 Drawing Figures

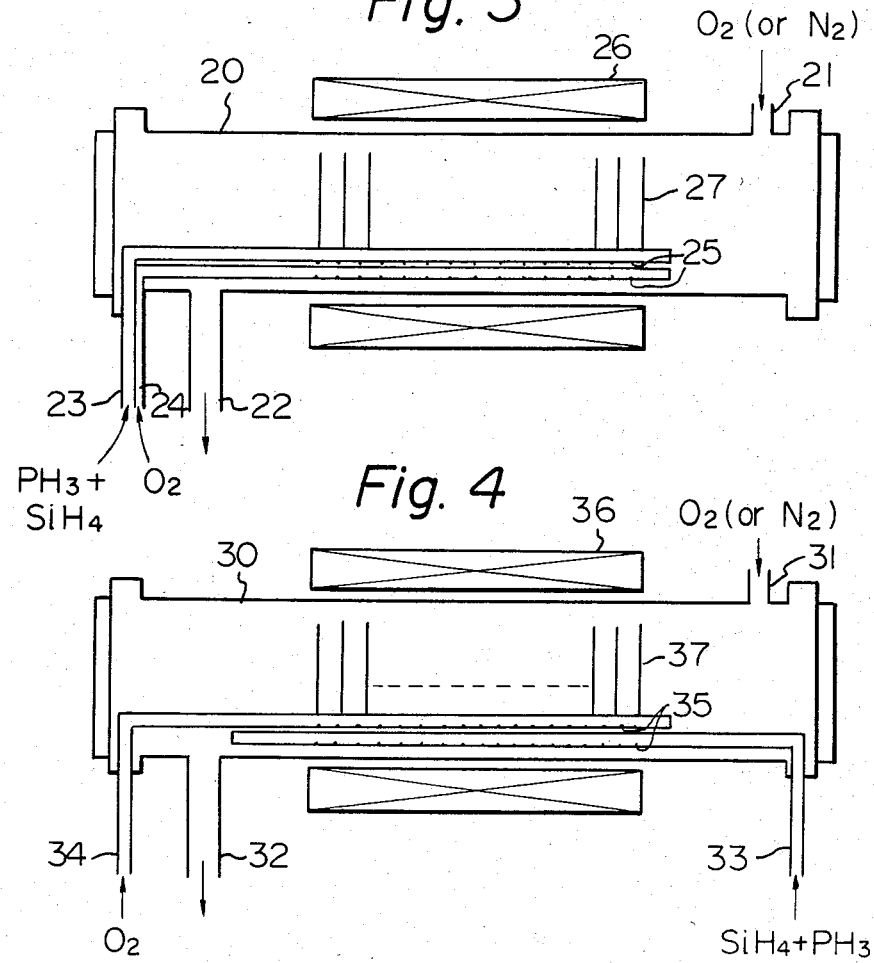
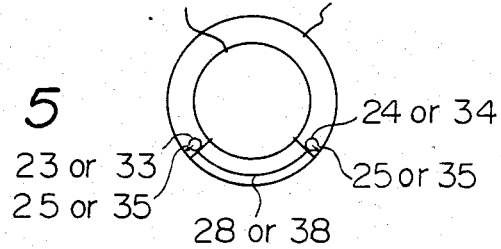

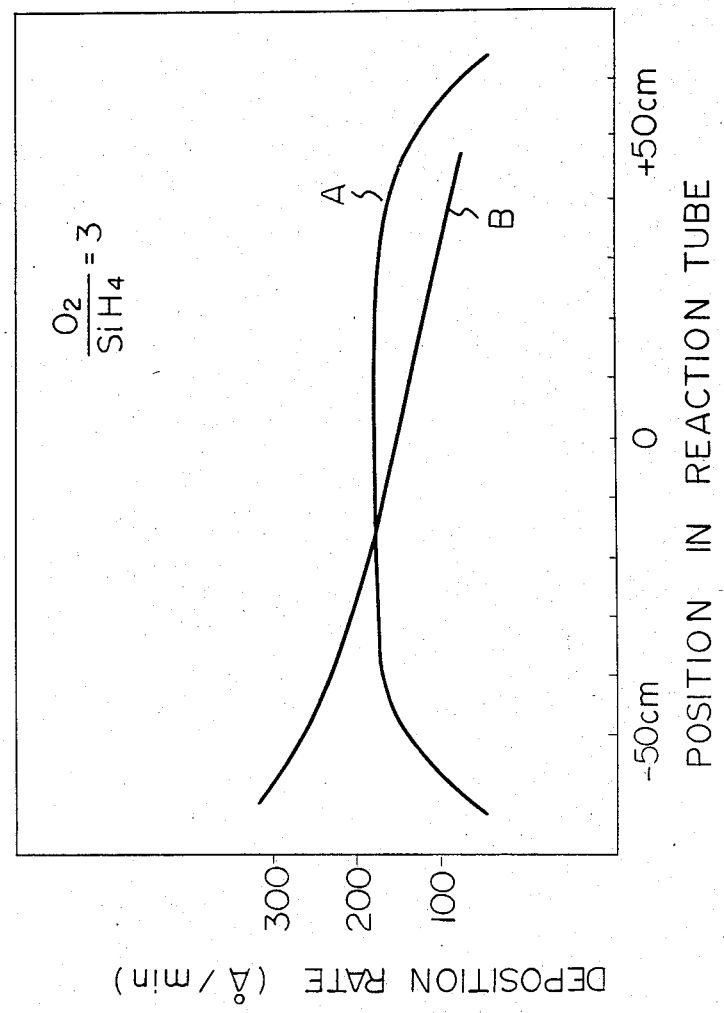

METHOD FOR COATING A SEMICONDUCTOR DEVICE WITH A PHOSPHOSILICATE GLASS

This is a continuation of application Ser. No. 295,618, filed Aug. 24, 1981, now abandoned.

BACKGROUND OF THE INVENTION

The present invention relates to a method for manufacturing a semiconductor device and, more specifically, it relates to a method for depositing phosphosilicate glass films on the surfaces of substrates (e.g. silicon substrates or aluminum wire patterns on silicon substrates) for semiconductor devices.

As is known in the art, a phosphosilicate glass film is widely used as a protective coating (or a passivation film), an interlaminar insulating film of multi-wire pattern layers or a solid diffusing source for an N-type impurity. In order to chemically deposit phosphosilicate glass films on substrates, a so-called "atmospheric pressure chemical vapor deposition method" is conventionally used. This is due to the fact that phosphosilicate glass films having a uniform thickness and having a uniform phosphorous concentration, can be readily obtained. In the atmospheric pressure method, a phosphosilicate glass film is deposited on a substrate in, for example, a bell-jar type reaction apparatus from a reaction gas mixture including monosilane ($SiH_4$), phosphine ($PH_3$) and oxygen ($O_2$) under atmospheric pressure and at a temperature of 350° through 450° C. However, the atmospheric pressure chemical vapor deposition methods have disadvantages in that mass production of the deposited phosphosilicate glass films on the substrates cannot be achieved, and cracks are likely to be generated in the deposited films during, for example, an annealing treatment at approximately 450° C. (i.e. to remove the surface state formed in the semiconductor device after the deposition of the phosphosilicate glass films). The generation of the cracks results in the decrease in the reliability of the semiconductor device.

In addition, a so-called "low pressure chemical vapor deposition" is also used. In this method, a phosphosilicate glass film is deposited on a substrate from a reaction gas mixture including $SiH_4$, $PH_3$ and $O_2$ under a low pressure (e.g. 1 Torr or less) and at a temperature of 350° through 450° C.

For instance, as shown in FIGS. 1 and 2, a reaction tube 10 made of, for example, quartz having an inner diameter of 120 mm$\phi$ and a uniform heating zone length of approximately 100 mm, is used for this purpose. In the reaction tube 10, gas inlets 11 and 12 are attached for feeding a gas mixture of $SiH_4$ and $PH_3$ and $O_2$ to one end thereof and an exhaust outlet 13 is attached to the other end thereof. Around the reaction tube 10, a heater 14 is mounted. In the practice of the chemical vapor deposition, plural substrates 15 for semiconductor devices made of, for example, silicon (i.e. wafers) are placed on a wafer holder 16 in such a state that the main surfaces of the wafers 15 are substantially vertically aligned with respect to one another and substantially perpendicularly intersect the central axis of the reaction tube 10. Then, a gas mixture of $SiH_4$ and $PH_3$ and an $O_2$ gas are fed from the gas inlets 11 and 12, while the inside of the reaction tube 10 is evacuated from the exhaust outlet 13 by means of a vacuum pump (not shown). Thus, phosphosilicate glass films are formed on the main surfaces of the wafers 15 under the conditions of, for example, a pressure of 0.5–1.0 Torr and a temperature of approximately 425° C. for 100 minutes.

However, there are problems in these conventional low pressure chemical vapor deposition methods in that when the amount of the $O_2$ gas fed into the reaction tube 10 is increased, the thicknesses and the qualities of the phosphosilicate glass films deposited on the surfaces of the plural wafers 15 are not uniform. For instance, the film thickness distribution of the phosphosilicate glass films deposited on the surfaces of the plural wafers is as much as ±30%. For this reason, the phosphosilicate glass films are conventionally deposited at a mol ratio of $O_2/SiH_4$ in the reaction feed gas of less than 2 (i.e. approximately 0.5–1.5). However, according to this method, hydrogen remains and is included in the deposited phosphosilicate glass films due to the fact that the amount of the $O_2$ gas in the reaction gas mixture is not sufficient. In the case where the phosphosilicate glass film contains a relatively large amount of hydrogen, cracks are likely to be generated in the deposited phosphosilicate glass films. The formation of the cracks in the deposited phosphosilicate glass films makes the phosphosilicate glass films useless. In addition, a relatively large amount of hydrogen causes the accumulation of phosphorus at the interface of the substrate and the phosphosilicate glass film when the phosphorous accumulated phosphosilicate glass films are heat-treated at a temperature of 900° C. or more.

SUMMARY OF THE INVENTION

Accordingly, an object of the present invention is to obviate the above-mentioned problems in the conventional deposition of phosphosilicate glass films on substrates and to provide a method for manufacturing a semiconductor device, whereby stable phosphosilicate glass films having a uniform thickness and quality and containing no substantial amount of hydrogen, are deposited on substrates at a high mass productivity.

Another object of the present invention is to provide a method for manufacturing a semiconductor device, whereby stable phosphosilicate glass films having a low phosphorus concentration, and, therefore, having an excellent water-vapor resistance, are deposited on substrates at a high mass productivity.

A further object of the present invention is to provide a method for manufacturing a semiconductor device, whereby stable phosphosilicate glass films, in which no substantial cracking occurs during the annealing of the semiconductor device after the deposition of the phosphosilicate glass films, are deposited on substrates at a high mass productivity.

Other objects and advantages of the present invention will be apparent from the description set forth hereinbelow.

In accordance with the present invention, there is provided a method for manufacturing a semiconductor device comprising the steps of:

(a) placing substrates for semiconductor devices to be treated in a reaction tube in such a state that the main surfaces of the substrates are substantially vertically aligned with respect to one another and substantially perpendicularly intersect the central axis of the reaction tube, the reaction tube being provided with at least two gas feed pipes having plural small openings pierced along the longitudinal direction thereof; and (b) introducing a silicon compound gas through one of the gas feed pipes into the reaction tube and introducing an oxidizing gas through the other of the gas feed pipes into the reaction tube, while maintaining the inside of the reaction tube under a reduced low pressure, whereby phosphosilicate glass films are deposited on the main surfaces of the substrates.

In accordance with the preferred embodiment of the present invention, a reaction gas mixture having a mol ratio of phosphine ($PH_3$) to phosphine and monosilane ($PH_3 + SiH_4$) of 0.08 or less is used in the above-mentioned manufacturing method of a semiconductor device.

BRIEF DESCRIPTION OF THE DRAWINGS

The present invention will be better understood from the description set forth below with reference to the accompanying drawings in which:

FIG. 3 is a schematic longitudinal sectional view illustrating one embodiment of a reaction tube for carrying out the present invention;

FIG. 4 is a schematic longitudinal sectional view illustrating another embodiment of a reaction tube for carrying out the present invention;

FIG. 5 is a schematic traverse sectional view illustrating the reaction tubes of FIGS. 3 and 4;

FIG. 6 is a graph illustrating the correlation between the deposition rate of the phosphosilicate glass films on wafers and the position of the wafers placed in the vapor deposition reaction tube;

DESCRIPTION OF THE PREFERRED EMBODIMENTS

Figure 1:
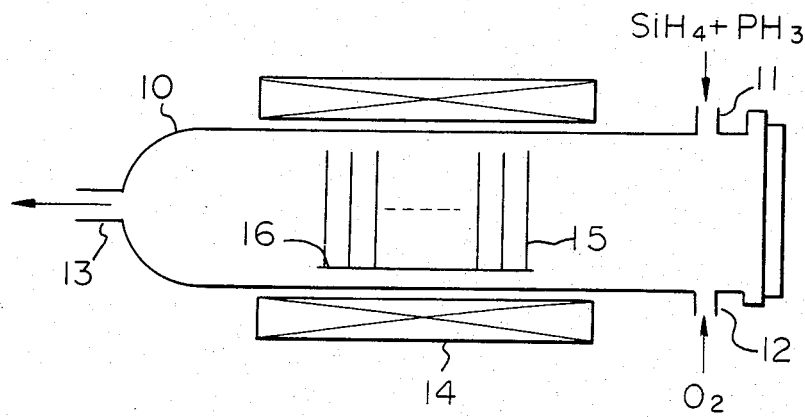
FIG. 1 a schematic longitudinal sectional view illustrating a typical conventional reaction tube for carrying out the conventional low pressure chemical vapor deposition method.

Referring to FIGS. 3, 4 and 5, typical examples of reaction tubes used in the practice of the present invention will now be explained. A reaction tube 20 or 30, made of, for example, quartz having an inner diameter of 120 mm$\phi$ and a constant heating zone length of approximately 100 mm is provided with an $O_2$ gas inlet 21 or 31 at one end thereof and an exhaust outlet 22 or 32 at the other end thereof.

In the inside of the reaction tube 20 or 30, gas feed pipes 23 or 33 and 24 or 34 having plural small openings 25 or 35 pierced along the longitudinal direction thereof, as shown in FIGS. 3, 4 and 5, are mounted in the substantially full length of the constant heating portion of the reaction tube 20 or 30. In the practice of the present invention, a gas mixture of $PH_3$ and $SiH_4$ is fed through the small openings 25 or 35 of the pipe 23 or 33, whereas an $O_2$ gas is fed through the small openings 25 or 35 of the pipe 24 or 34. In the embodiment of FIG. 3, both gas feed pipes 23 and 24 are inserted into the reaction tube 20 from one end portion thereof. It should be noted that these gas feed pipes 23 and 24 can also be inserted into the reaction tube 20 from the opposite end portion of the reaction tube 20. In contrast, in the embodiment of FIG. 4, the gas feed pipes 33 and 34 are inserted into the reaction tube 30 from different end portions thereof. It should be noted that the pipes 33 and 34 can also be exchangeable with each other. As shown in FIG. 5, the small openings 25 or 35 are desirably pierced in such a manner that the gas is outwardly and radially discharged from the openings. A heater 26 or 36 is mounted around the reaction tube 20 or 30, so that the constant heating zone of the reaction tube 20 or 30 can be uniformly heated to a desired temperature.

Although the embodiments of the reaction tubes in which two gas feed pipes 23 and 24 or 33 and 34 are mounted are illustrated in FIGS. 3, 4 and 5, it should be noted that a gas mixture of $PH_3$ and $SiH_4$ and/or an $O_2$ gas can be fed through plural gas pipes and also that such plural pipes can be placed at any configuration in the cross section of the pipes.

In the practice of the deposition of phosphosilicate glass film on substrates, e.g. silicon wafers, plural wafers 27 or 37 are placed on a wafer holder 28 or 38 in such a state that the main surfaces of the wafers 27 or 37 are substantially vertically aligned with respect to one another and are substantially perpendicularly intersected by the central axis of the reaction tube 20 or 30. Then, a gas mixture of $SiH_4$ and $PH_3$ is fed from a gas inlet pipe 23 or 33 and an oxygen gas is fed from a gas inlet 21 or 31 and a gas feed pipe 24 or 34, while the inside of the reaction tube 20 or 30 is evacuated by means of a vacuum pump (not shown).

For instance, phosphosilicate glass films were deposited on the surfaces of silicon wafers by using a reaction tube as shown in FIGS. 4 and 5 as follows.

In the uniform heating zone of the reaction tube 30 having a length of about 1 m and heated to a temperature of about 425° C., 70 sample silicon wafers 37 were placed at 15 mm intervals. Further, 20 dummy silicon wafers 37 were placed at each end of the sample silicon wafers 37. Thus, 110 silicon wafers 37 were present in the uniform heating zone of the reaction tube 30. The system within the reaction tube 30 was evacuated through the exhaust outlet 32 by means of a vacuum pump (not shown) and the temperature of the uniform heating zone of the reaction tube 30 was heated to a temperature of approximately 425° C. by means of the heater 36. Thus, a reaction gas mixture of $SiH_4$ and $PH_3$, having a mol ratio of $PH_3$ to $PH_3$ and $SiH_4$ of 0.08, was fed through the pipe 33 at a gas feed rate of 44 cc/min and an $O_2$ gas was fed through the pipe 34 and the inlet nozzle 31 at a gas feed rate of 30 cc/min and 90 cc/min, respectively, while the pressure of the system was maintained at a vacuum pressure of 0.35 Torr. The gas feed volume ratio of $O_2$ to the mixture of $SiH_4$ was 3. The deposition of phosphosilicate glass films on the wafers 37 was carried out for 50 minutes under the abovementiioned conditions. As a result of an infrared absorption spectrophotometric analysis, no substantial amount of Si—$H_2$ (or $Si_2O_3$) bond was included in the deposited phosphosilicate glass films on the sample silicon wafers.

Figure 2:
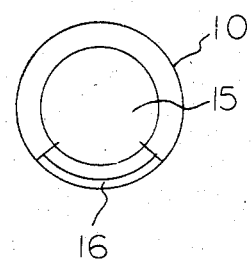
FIG. 2 is a schematic traverse sectional view illustrating a typical conventional reaction tube of FIG. 1.

On the other hand, the above-mentioned deposition of phosphosilicate glass films on silicon wafers was repeated, except that a conventional reaction tube 10 as shown in FIGS. 1 and 2 was used, instead of the reaction tube 20 or 30 as shown in FIGS. 4 and 5. As a result of the infrared absorption spectrophotometric analysis of the resultant phosphosilicate glass films deposited on the silicon wafers, it was observed that a substantial amount of Si—$H_2$ (or $Si_2O_3$) bond was included in the resultant phosphosilicate glass films.

The correlations between the deposition rate (Å/min) of the phosphosilicate glass films on the silicon wafers and the position of the wafers placed in the heating zone of the reaction tube are shown in FIG. 6. The position of the wafers is represented by the distance (cm) from the center of the uniform heating zone of the reaction tube. In FIG. 6, a curve A represents the correlation obtained from the above-mentioned experiment according to the present invention in which the reaction tube 30, provided with two gas feed pipes 33 and 34, as shown in FIGS. 4 and 5, was used, whereas a curve B represents the correlation obtained from the above-mentioned comparative experiment in which the reaction tube 10, provided with no gas feed pipe therein, was used. As is clear from the results shown in FIG. 6, according to the present invention, the phosphosilicate glass films were substantially uniformly deposited on the surfaces of the 70 silicon wafers and the uniformity of the deposited films was remarkably improved as compared with the comparative experiment using the apparatus of FIG. 1.

Figure 7:
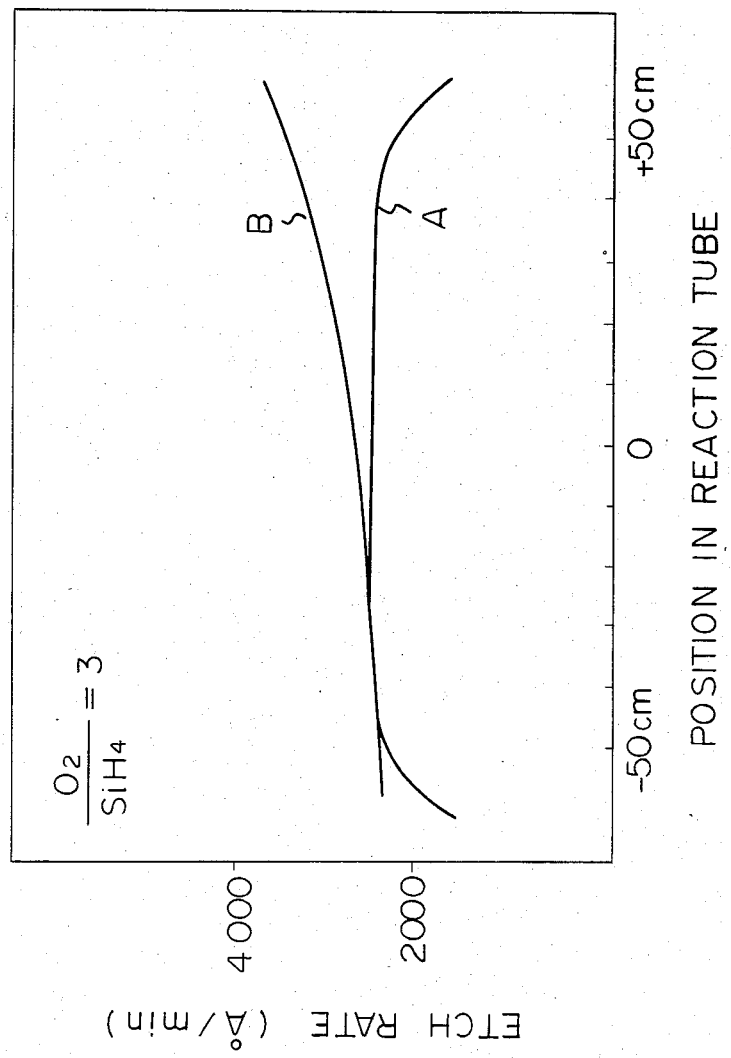
FIG. 7 is a graph illustrating the correlation between the etch rate of the deposited phosphosilicate glass films on wafers and the position of the wafers placed in the vapor deposition reaction tube.

In addition, the correlations between the etch rate (Å/min) of the phosphosilicate glass films on the silicon wafers and the position of the wafers placed in the uniform heating zone of the reaction tube are shown in FIG. 7. The etching was carried out by using hydrogen fluoric acid under the conditions of a temperature of 20° C. and a ratio of $HF:H_2O = 1.25:98.75$. In FIG. 7, a curve A represents the correlation obtained from the above-mentioned experiment according to the present invention in which the reaction tube 30, provided with two gas feed pipes 33 and 34, as shown in FIGS. 4 and 5, was used, whereas a curve B represents the correlation obtained from the above-mentioned comparative experiment in which the reaction tube 10, provided with no gas feed pipe therein, was used.

As is clear from the results shown in FIG. 7, according to the present invention, the phosphosilicate glass films deposited on the surface of the 70 silicon wafers were uniformly etched at a substantially uniform etch rate and the uniformity in the etch rate of the deposited phosphosilicate glass films was remarkably improved as compared with the comparative experiment using the apparatus of FIG. 1. Since the etch rate of the phosphosilicate glass films is proportional to the content of phosphorus in the deposited phosphosilicate glass films, the above results of the present invention indicate that the phosphorus was uniformly included in the phosphosilicate glass films deposited on the surface of the 70 silicon wafers.

In addition to the above-mentioned experiments, the deposition of the phosphosilicate glass films on silicon wafers was carried out by changing the gas feed rate. For instance, in the case of the gas feed mol ratio of $O_2$ to $SiH_4$ ($O_2/SiH_4$) of 2 (gas feed rate of $SiH_4$ and $PH_3$ was 44 cc/min), no $Si-H_2$ (or $Si_2O_3$) bond was included in the deposited phosphosilicate glass films. As the above-mentioned ratio of $O_2$ to $SiH_4$ is increased to 3 or 4, the mass productivity of the deposition of the phosphosilicate glass films on the surfaces of silicon wafers is gradually decreased. Therefore, the ratio of $O_2$ to $SiH_4$ and $PH_3$ is most desirably within the range of 2 through 3. Since the thickness of the phosphosilicate glass films on the wafers depends upon the feed amount of $SiH_4$ and the like, the use of a feed rate of $SiH_4$ which is too small, is not preferable.

In the case where the deposition of the phosphosilicate glass films on the wafers was carried out in a manner as described in the above-mentioned experiment, except that the reaction tube 20 as shown in FIG. 3 was used, instead of the reaction tube 30 as shown in FIG. 4, results similar to the above-mentioned results were obtained.

Although oxygen was fed through the inlet 21 or 31 in the above-mentioned experiments, nitrogen gas or the like can be fed through the inlet 21 or 31 to effect the smooth gas flow of the reaction gas mixture in the reaction tube, as long as a sufficient amount of oxygen is fed through the pipe 24 or 34.

Thus, according to the present invention, the gas mixture of $SiH_4$ and $PH_3$ and the oxygen gas are separately fed to the reaction tube through the plural small openings 25 or 35 pierced in the pipes 23 and 24 or 33 and 34 and oxygen gas can be further fed from the gas inlet 21 or 31. As a result, no substantial amount of $Si-H_2$ (or $Si_2O_3$) bond is included in the deposited phosphosilicate glass films, and phosphosilicate glass films having a uniform thickness and uniform film quality are deposited on substrates.

As mentioned hereinabove, according to the preferred embodiment of the present invention, a reaction gas mixture having a mol ratio of $PH_3$ to $PH_3$ and $SiH_4$ ($PH_3/PH_3+SiH_4$) of 0.08 or less, preferably 0.03 through 0.08, is used to obtain deposited phosphosilicate glass films having a low phosphorus content at a high mass productivity and in which no substantial cracking occurs during, for example, the annealing step of manufacturing the semiconductor device.

The experimental results obtained from the use of the reaction tube 30 as shown in FIGS. 4 and 5 will now be explained.

In the uniform heating zone of the reaction tube 30 having a length of about 2 m and heated to a temperature of about 425° C., sample silicon wafers 37 were placed at 15 mm intervals. The system within the reaction tube 30 was evacuated from the exhaust outlet 32 by means of a vacuum pump (not shown) and maintained under a vacuum pressure of 0.1 through 0.2 Torr during the deposition experiment. Thus, phosphosilicate glass films were deposited on the surfaces of the silicon wafers in the form of discs, each having a diameter of 4 inches, by using various gas feed rates of $O_2$ gas and a gas mixture of $SiH_4$ and $PH_3$. The oxygen gas was fed through the many small openings of the pipe 34, the gas inlet 31 and the gas mixture of $SiH_4$ and $PH_3$ was fed through the many small openings of the pipe 35.

Figure 8:
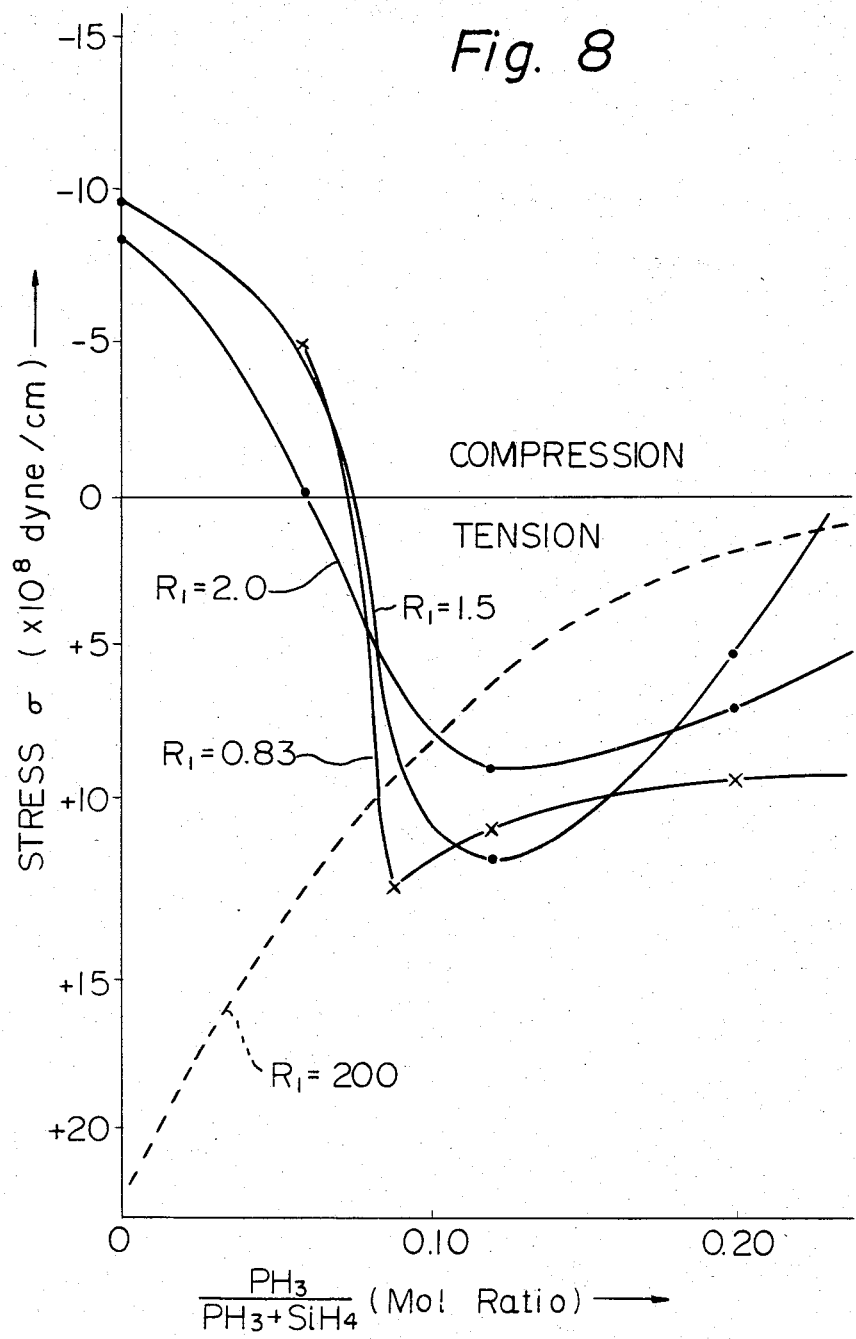
FIG. 8 is a graph illustrating the correlation between the stress of the phosphosilicate glass films deposited on wafers and the mol ratio of $PH_3$ to $PH_3 + SiH_4$ in the deposition reaction gas mixture.

The correlation between the stress of the phosphosilicate glass films deposited on the wafers and the mol ratio of $PH_3$ (mol) to $SiH_4$ (mol) and $PH_3$ (mol) in the reaction gas mixture, which was obtained from a series of the experiments, is shown in FIG. 8. In FIG. 8, $R_1$ represents a mol ratio of $O_2$ (mol) to $SiH_4$ (mol) contained in the total reaction gas mixture. In the case of $R_1 = 200$, the deposition was carried out under an atmospheric pressure. The stress $\sigma$ ($\times 10^8$ dyne/cm$^2$) of each phosphosilicate glass film having a thickness of 1 micron at room temperature was determined according to a so-called Newton ring method.

As shown in FIG. 8, in the case of the mol ratio of $PH_3$ to $PH_3$ and $SiH_4$ of 0.08 or less, the deposited phosphosilicate glass films are under compressive stress (i.e. the phosphosilicate glass films become convex). Contrary to this, in the case of the mol ratio of $PH_3$ to $PH_3$ and $SiH_4$ of more than 0.08, the deposited phosphosilicate glass films are under tensile stress (i.e. the phosphosilicate glass films become concave). This means that, in the case where the phosphosilicate glass films are deposited on silicon wafers at a mol ratio of $PH_3/PH_3+SiH_4$ of 0.08 or less, it is difficult for cracking to be generated in the deposited phosphosilicate glass films since the resultant deposited films are under compressive stress. This is because, in the case where the deposited phosphosilicate glass films are under compressive stress, the stress does not become larger at room temperature when the films are annealed at room temperature.

Referring to the dotted curve in FIG. 8, in the case where the phosphosilicate glass films are deposited at an $R_1$ of 200 according to a so-called atmospheric pressure chemical vapor deposition method, the cracking readily occurs especially where a low phosphorus content is present (i.e. the tensile stress is increased with the decrease in $PH_3$ content in the reaction gas mixture).

In order to actually observe the generation of the cracking in the deposited phosphosilicate glass films, the following two series of experiments were carried out.

In the first experiments, aluminum layers, each having a thickness of 1 micron, were first deposited on the entire main surfaces of silicon wafers in the form of discs each having a diameter of 4 inches and, then, phosphosilicate glass films, each having a thickness of 1 micron, were deposited on the surfaces of the aluminum layers. The deposition of the phosphosilicate glass films was carried out under the following conditions.

| Pressure: | 0.1–0.2 Torr |
| --- | --- |
| Temperature: | 425° C. |
| Mol Ratio of $O_2/SiH_4$ ($R_1$): | listed in Table 1 below |
| Mol Ratio of $PH_3/PH_3 + SiH_4$ ($R_2$): | listed in Table 1 below |

The generation of cracking of the resultant phosphosilicate glass films was observed at a temperature of 450° C. The results are shown in the following Table 1.

TABLE 1

| $R_1$ | $R_2$ | 1c | 2c | 3c | 4c | 5c |
| --- | --- | --- | --- | --- | --- | --- |
| 0.83 | 0 | − | − | − | − | − |
|  | 0.06 | − | − | − | − | − |
|  | 0.09 | + | + | + | +++ | +++ |
|  | 0.12 | − | + | + | + | + |
|  | 0.20 | − | − | − | − | − |
| 1.2 | 0 | − | − | − | − | − |
|  | 0.09 | − | + | + | ++ | ++ |
| 1.5 | 0 | − | − | − | − | − |
|  | 0.06 | − | − | − | − | − |
|  | 0.08 | − | − | − | + | + |
|  | 0.09 | + | + | + | ++ | ++ |
|  | 0.10 | − | − | + | + | + |
|  | 0.12 | − | − | − | − | − |
|  | 0.20 | − | − | − | − | − |
| 2.0 | 0 | − | − | − | − | − |
|  | 0.06 | − | − | − | − | − |
|  | 0.09 | + | + | + | + | + |
|  | 0.12 | − | − | − | − | − |
|  | 0.20 | − | − | − | − | − |

−: No cracking
+: Cracking in the edge portion (of wafer) having a width of 1 mm.
++: Cracking in the edge portion having a width of 2 mm
+++: Cracking in the edge portion having a width of 5 mm In the second experiment, a specified aluminum pattern having a thickness of 1 micron was formed on the main surfaces of silicon wafers and, then, phosphosilicate glass films, each having a thickenss of 1 micron, were deposited on the aluminum pattern. The deposition of the phosphosilicate glass films was carried out under the following conditions.

| Pressure: | 0.1–0.2 Torr |
| --- | --- |
| Temperature: | 425° C. |
| $R_1$: | listed in Table 2 below |
| $R_2$: | listed in Table 2 below |

The generation of cracking of the resultant phosphosilicate glass films was observed at a temperature of 450° C. The results are shown in the following Table 2.

TABLE 2

| $R_1$ | $R_2$ | 1c | 2c | 3c | 4c | 5c |
| --- | --- | --- | --- | --- | --- | --- |
| 0.83 | 0 | − | − | − | − | − |
|  | 0.06 | − | − | − | − | − |
|  | 0.09 | − | − | + | + | + |
|  | 0.12 | − | − | − | − | − |
|  | 0.20 | − | − | − | − | − |
| 1.2 | 0 | − | − | − | − | − |
|  | 0.09 | − | − | − | + | + |
| 1.5 | 0 | − | − | − | − | − |
|  | 0.06 | − | − | − | − | − |
|  | 0.08 | − | − | − | − | − |
|  | 0.09 | − | − | + | ++ | ++ |
|  | 0.10 | − | − | + | + | + |
|  | 0.12 | − | − | − | − | − |
|  | 0.20 | − | − | − | − | − |
| 2.0 | 0 | − | − | − | − | − |
|  | 0.06 | − | − | − | − | − |
|  | 0.09 | − | − | + | + | + |
|  | 0.12 | − | − | − | − | − |
|  | 0.20 | − | − | − | − | − |

−: No cracking
+: Cracking in the edge portion (of wafer) having a width of 1 mm
++: Cracking in the edge portion having a width of 2 mm In the results shown in Tables 1 and 2, 1c, 2c, 3c, 4c and 5c represent the number of heat cycles at 450° C. in nitrogen atmosphere (1 cycle was 30 minutes).

As is clear from the results shown in Tables 1 and 2, in the phosphosilicate glass films deposited at a mol ratio of $PH_3$ to $PH_3$ and $SiH_4$ (i.e. $R_2$) of 0.08 or less, no cracking was generated in the (practical) area of the semiconductor device irrespective of the mol ratio of $O_2$ to $SiH_4$ (i.e. $R_1$). It should be noted that similar results would be obtained in the phosphosilicate glass films as interlaminar insulating films and passivation films.

As is also clear from the results shown in Tables 1 and 2, no cracking was generated in the phosphosilicate glass films deposited at a mol ratio $R_2$ of 0.12 to 0.20. However, in the case where the phosphorus content in the phosphosilicate glass film becomes large, the water vapor resistance is undesirably decreased because of the absorption of water due to the presence of phosphoric acid formed in the film. Especially when the phosphosilicate glass films are used as a cover film for semiconductor devices, the decrease in the water vapor resistance of the film should be avoided. For this reason, the use of $R_2$ of 0.08 or less is desirable. On the other hand, when the phosphosilicate glass film is used as an interlaminar insulation film for wire pattern layers, the films deposited at a mol ratio $R_2$ of larger than 0.08 are acceptable and rather preferable. This is because, when the heat treatment is carried out to make the edge portion of the through-hole gentle, more gentle edge portions can be readily formed due to the fact that the phosphosilicate glass film is easy to melt at the phosphorus content of the film is high.

As mentioned hereinabove, according to the present invention, since the deposition of the phosphosilicate glass films is carried out according to a low pressure method, the phosphosilicate glass films can be simultaneously deposited on the surfaces of a lot of substrates to be treated placed in the reaction tube at an extremely high mass productivity.

Furthermore, since a deposition gas mixture having an extremely low mol concentration of $PH_3$ is used in the deposition of phosphosilicate glass films of the present invention, the phosphorus content in the resultant phosphosilicate glass films is extremely low and, as a result, the water-vapor resistance of the deposited films is excellent. In addition, since phosphosilicate glass films having compressive stress are formed according to the present invention, the generation of heat cracking in the phosphosilicate glass films is largely obviated.

Consequently, according to the present invention, since phosphosilicate glass films having the abovementioned advantages can be deposited, as interlaminar insulating films or passivation films, on the substrates for semiconductor devices suitable for use in semiconductor integrated circuits, the reliability of the semiconductor devices is remarkably improved.

We claim:

1. A method for manufacturing semiconductor devices in a reaction tube provided with a gas inlet adjacent one end of the reaction tube, a gas outlet adjacent the opposite end of the reaction tube and at least two gas feed pipes having plural small openings pierced along the longitudinal direction thereof, comprising the steps of:

(a) positioning plural substrates for the semiconductor devices to be treated in the reaction tube so that the main surfaces of the plural substrates are substantially vertically aligned with respect to one another and are substantially perpendicularly intersected by the longitudinal axis of the reaction tube;

(b) introducing a silicon compound gas including a phosphorus compound gas through one of the at least two gas feed pipes having plural small openings into the reaction tube and introducing an oxidizing gas through the other of the at least two gas feed pipes out the plural small openings into the reaction tube, while maintaining the inside of the reaction tube under a reduced pressure by evacuating the inside of the reaction tube through the gas outlet; and (c) introducing a gas into the reaction tube through the gas inlet to establish a gas flow, for the gases introduced into the reaction tube in said steps (b) and (c), in a direction along the longitudinal axis of the reaction tube from the gas inlet, via the periphery of the plural substrates, toward the gas outlet to expose the plural substrates to the gas flow, whereby phosphosilicate glass films are deposited on the main surfaces of the plural substrates.

2. A method as claimed in claim 1, wherein said silicon compound gas introducing step comprises introducing monosilane ($SiH_4$) and phosphine ($PH_3$) and wherein said oxidizing gas introducing step comprises introducing oxygen ($O_2$).

3. A method as claimed in claim 2, wherein the mol ratio of phosphine to phosphine and monosilane ($PH_3/PH_3+SiH_4$) is 0.08 or less.

4. A method as claimed in claim 2, wherein the mol ratio of oxygen to phosphine and monosilane ($O_2/PH_3+SiH_4$) is from 2 to 3.

5. A method as claimed in claim 3, wherein the mol ratio of phosphine to phosphine and monosilane ($PH_3/PH_3+SiH_4$) is from 0.03 to 0.08.

6. A method as claimed in claim 3, wherein the mol ratio of oxygen to phosphine and monosilane ($O_2/PH_3+SiH_4$) is from 2 to 3.

7. A method as claimed in claim 1, wherein the reduced low pressure is from 0.1–0.2 torr.

8. A method as claimed in claim 1, further comprising heating the reaction tube.

9. A method as claimed in claim 8, wherein the reaction tube is heated in a range from 425° C. to 450° C.

* * * * *

UNITED STATES PATENT AND TRADEMARK OFFICE
CERTIFICATE OF CORRECTION

PATENT NO. : 4,513,026
DATED : APRIL 23, 1985
INVENTOR(S) : HIDEKAZU MIYAMOTO ET AL.

It is certified that error appears in the above-identified patent and that said Letters Patent is hereby corrected as shown below:

FRONT PAGE, Col. 2, FOREIGN PATENT DOCUMENTS
   line 2, "125979" should be --125974--.

Col. 2, line 58, after "placing" insert --plural--.

Col. 4, line 55, "mentiioned" should be --mentioned--;

line 57, "Si--$H_2$" should be --Si-$H_2$--.

Signed and Sealed this

Fourteenth Day of January 1986

[SEAL]

Attest:

DONALD J. QUIGG

Attesting Officer

Commissioner of Patents and Trademarks